United States Patent
Murai et al.

(10) Patent No.: US 7,851,564 B2
(45) Date of Patent: Dec. 14, 2010

(54) SILICONE RESIN COMPOSITION

(75) Inventors: Shinji Murai, Sagamihara (JP); Koji Asakawa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 456 days.

(21) Appl. No.: 11/958,111

(22) Filed: Dec. 17, 2007

(65) Prior Publication Data
US 2008/0220266 A1      Sep. 11, 2008

(30) Foreign Application Priority Data
Mar. 5, 2007    (JP) .............................. 2007-054679

(51) Int. Cl.
*C08G 77/08* (2006.01)
(52) U.S. Cl. .......................... 525/478; 528/15; 528/31; 528/32; 524/588; 428/447
(58) Field of Classification Search ................ 525/478; 528/15, 31, 32; 428/447
See application file for complete search history.

(56) References Cited

U.S. PATENT DOCUMENTS

| | | | | |
|---|---|---|---|---|
| 5,082,886 A | * | 1/1992 | Jeram et al. .................. | 524/403 |
| 5,989,719 A | * | 11/1999 | Loiselle ....................... | 428/447 |
| 6,124,407 A | * | 9/2000 | Lee et al. ..................... | 525/478 |
| 6,501,219 B1 | * | 12/2002 | Bigio et al. .................. | 313/569 |
| 6,623,864 B1 | * | 9/2003 | Sweet et al. ................. | 428/447 |
| 7,479,522 B2 | * | 1/2009 | Zhu ............................. | 524/588 |
| 2004/0116640 A1 | | 6/2004 | Miyoshi ....................... | 528/12 |
| 2008/0220266 A1 | | 9/2008 | Murai et al. | |

FOREIGN PATENT DOCUMENTS

| | | |
|---|---|---|
| JP | 3-149260 | 6/1991 |
| JP | 2000-129132 | 5/2000 |
| JP | 2000-198930 | 7/2000 |
| JP | 2004-186168 | 7/2004 |
| JP | 2004-292714 | 10/2004 |
| JP | 2005-42099 | 2/2005 |
| JP | 2006-335857 | 12/2006 |
| JP | 2007-103494 | 4/2007 |
| JP | 2008-214512 | 9/2008 |

OTHER PUBLICATIONS

Japanese Search Report from corresponding JP appln No. 2007-054679 dated Feb. 12, 2009.

* cited by examiner

*Primary Examiner*—Margaret G Moore
(74) *Attorney, Agent, or Firm*—Ohlandt, Greeley, Ruggiero & Perle, L.L.P.

(57) ABSTRACT

A silicone resin composition is provided, which includes an alkenyl group-containing polysiloxane represented by the following average composition formula (PSA(1)), a hydro group-containing polysiloxane represented by the following average composition formula (PSA(2)), two kinds of polysiloxane, both having opposite ends sealed with a vinyl group, which are represented by the following formulas (PSC(1) and PSC(4)), and a hydrosilylating catalyst:

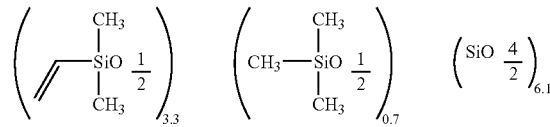

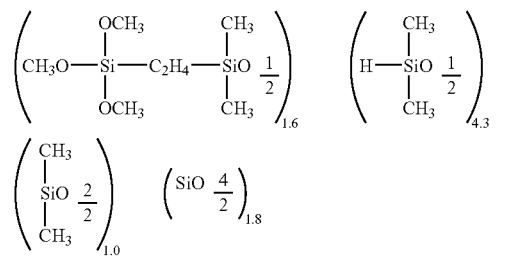

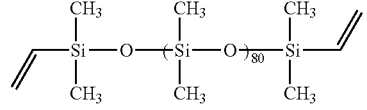

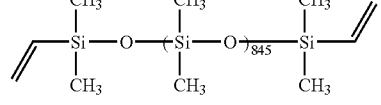

16 Claims, 1 Drawing Sheet

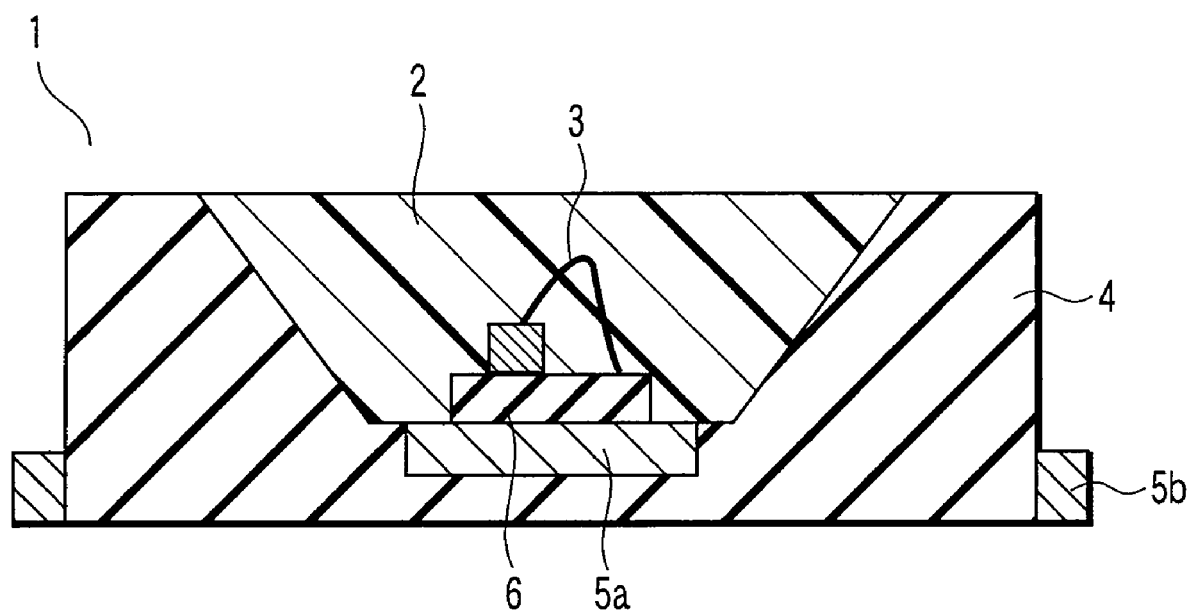
FIGURE

SILICONE RESIN COMPOSITION

CROSS-REFERENCE TO RELATED APPLICATIONS

This application is based upon and claims the benefit of priority from prior Japanese Patent Application No. 2007-054679, filed Mar. 5, 2007, the entire contents of which are incorporated herein by reference.

BACKGROUND OF THE INVENTION

1. Field of the Invention

This invention relates to a silicone resin composition and to a resin-encapsulated semiconductor device using the silicone resin composition.

2. Description of the Related Art

The conventional white LED is accompanied with an increasing problem that the epoxy resin sealing material employed therein is caused to turn yellow during the actual use thereof due to the exposure thereof to ultraviolet rays, etc. Additionally, due to the recent trend to further miniaturize the white LED, the quantity of heat released from the white LED is caused to increase, resulting in the generation of cracks in the epoxy resin sealing material. Therefore, it is urgently required to take countermeasures to cope with this new problem. In order to cope with these problems, attempts are being taken to employ silicone resin having a large number of phenyl groups in the molecule thereof.

As for the light source for the LED in future, there is an increasing trend to use one which is further lower in wavelength. Due to the fact that the conventional epoxy sealing material as well as phenyl-containing silicone resin is inferior in light transmission properties as far as a lower wavelength region is concerned, it is expected to be difficult to apply these materials to an LED where a lower wavelength region is employed as a light source. Although resin compositions containing a linear or cyclic silicone resin have been also proposed as a sealing material for the LED, these conventional resin compositions are incapable of securing a sufficient degree of adhesion due to the cure shrinkage thereof.

BRIEF SUMMARY OF THE INVENTION

A silicone resin composition according to one aspect of the present invention comprises:

a) an alkenyl group-containing polysiloxane represented by the following average composition formula "A":

$$R_n SiO_{(4-n)/2}(SiO_2) \quad\quad A$$

wherein R consists of an alkenyl group of 0.1 to 95 mole % and an alkyl group having 1 to 4 carbon atoms; and n is an integer of 1 to 3, the alkenyl group-containing polysiloxane having a weight average molecular weight of 400 to 30000 and including 20 to 80 mole % of a Q unit represented by the following formula "C":

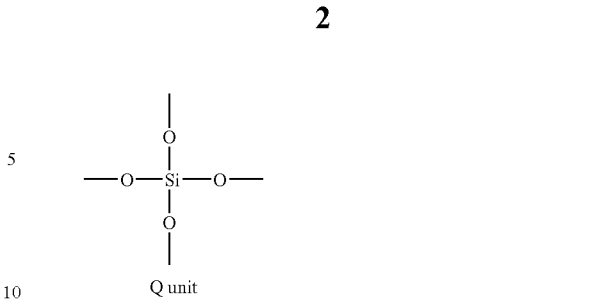

Q unit b) a hydro group-containing polysiloxane represented by the following average composition formula "B":

$$R'_m SiO_{(4-m)/2}(SiO_2) \quad\quad B$$

wherein R' consists of a hydro group of 0.1 to 95 mole % and an alkyl group having 1 to 4 carbon atoms; and m is an integer of 1 to 3, the hydro group-containing polysiloxane having a weight average molecular weight of 100 to 10000 and including 10 to 50 mole % of a Q unit represented by the aforementioned formula: and c) a pair of polysiloxane each having opposite ends sealed with a vinyl group, differing in the range of "k" and represented by the following average composition formula "C":

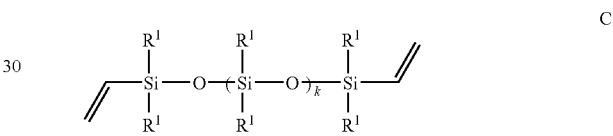

wherein $R^1$s may be the same or different and are individually selected from an alkyl group having 1 to 4 carbon atoms; and k is 20 to 300 or 700 to 1200; and d) a hydrosilylating catalyst.

A resin-encapsulated semiconductor device according to another aspect of the present invention comprises:

a light-emitting element; and a resin layer sealing the light-emitting element and formed of a cured material of the above-mentioned silicon resin composition.

BRIEF DESCRIPTION OF THE SEVERAL VIEWS OF THE DRAWING

The single FIGURE is a diagram schematically illustrating the structure of a resin-encapsulated semiconductor device according to one aspect of the present invention.

DETAILED DESCRIPTION OF THE INVENTION

Next, various embodiments of the present invention will be explained.

The silicone resin composition according the embodiment comprises three different kinds of polysiloxane and a hydrosilylating catalyst.

A first polysiloxane to be included in the silicone resin composition according to the embodiment is an alkenyl group-containing polysiloxane represented by the aforementioned average composition formula (A).

0.1 to 95 mole % of R in the average composition formula (A) should be occupied by an alkenyl group. If the content of the alkenyl group is too small, the curing reaction will become insufficient, thus making it difficult to create a cured material having a sufficiently high hardness. On the other hand, if the content of alkenyl group is too large, unreacted alkenyl group may remain, thereby generating a problem that the light transmission properties of the cured material may be deteriorated. As examples of the alkenyl group, they include a vinyl group having 2-8 carbon atoms, allyl group, butenyl group and pentenyl group. When the transparency of silicone resin after the curing thereof and availability of silicone resin are taken into account, a vinyl group is most preferable for use as the alkenyl group.

The balance of R in the average composition formula (A) should be occupied by an alkyl group having 1 to 4 carbon atoms. In view of easiness of synthesis and cost, the employment of a methyl group is most preferable among the alkyl groups.

At least one of hydrogen atoms in the aforementioned alkenyl group and alkyl group may be substituted by a heteroatom such as halogen atom, Si atom, O atom, N atom and S atom.

As shown by the aforementioned formula, the Q unit is configured such that four bonding hands of an Si atom are bonded to an O atom, thus enabling these bonding hands to have a functional group, respectively. Due to this specific structure, the Q unit is advantageous in that the crosslink density can be enhanced, resulting in an increased hardness of the cured material to be obtained. As long as the content of the Q unit in the aforementioned average composition formula (A) is not less than 20 mole %, it is possible to secure this advantage. However, if the content of the Q unit is too large, the hardness of the cured material to be obtained will become too high, thereby raising a problem that it may become difficult to secure a desirable adhesive property. Therefore, the upper limit in content of the Q unit in the aforementioned average composition formula (A) should be confined to not more than 80 mole %.

The alkenyl group-containing polysiloxane represented by the aforementioned average composition formula (A) should be selected from those having a weight average molecular weight ranging from 400 to 30,000. By the term "weight average molecular weight" as set forth in the present specification, it means a weight average molecular weight reduced in terms of polystyrene by GPC (Gel Permeation Chromatography). If the weight average molecular weight of the alkenyl group-containing polysiloxane is less than 400, it may become difficult to obtain a cured material having a sufficiently high hardness. On the other hand, if the weight average molecular weight of the alkenyl group-containing polysiloxane is higher than 30,000, the adhesive property thereof will be deteriorated. The weight average molecular weight of the alkenyl group-containing polysiloxane should preferably be confined to the range of 1000 to 10,000, more preferably 2000 to 8,000.

Incidentally, when the easiness of synthesis of polysiloxane is taken into account, "n" in the aforementioned average composition formula (A) should preferably be confined to the range of 1 to 3.5. When the hardness of cured material to be obtained is taken into account, it is especially preferable to confine the value of "n" is 3.

This alkenyl group-containing polysiloxane may be partially comprised of $R_2SiO_{2/2}$ (D unit) or $RSiO_{3/2}$ (T unit).

The alkenyl group-containing polysiloxane represented by the aforementioned average composition formula (A) can be easily synthesized using a combination of compounds for constituting specific units of raw materials (M unit, Q unit) at the aforementioned molar ratios and by subjecting these compounds to cohydrolysis in the presence of an acid.

As the raw materials for the $SiO_2$ unit (Q unit), they include sodium silicate, alkyl silicate, polyalkyl silicate and silicon tetrachloride.

As the raw materials for the $R_3SiO_{0.5}$ unit (M unit), they include the compounds which can be represented by the following chemical formulas.

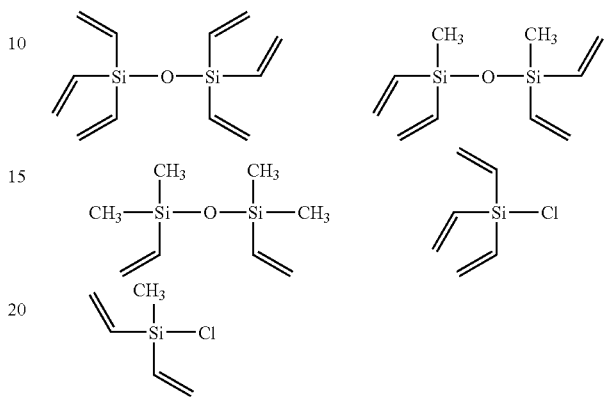

As examples of raw material for $R'_3SiO_{0.5}$ unit (M unit), they include compounds represented by the following chemical formulas.

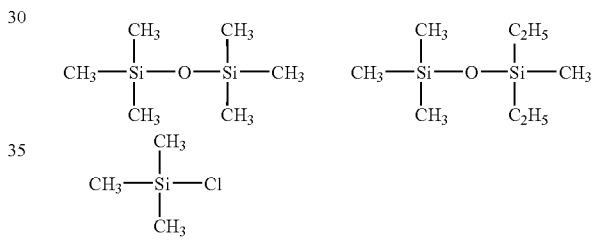

As the alkenyl group-containing polysiloxane to be incorporated into the silicone composition according to the embodiment, it is possible to employ the following compound for instance.

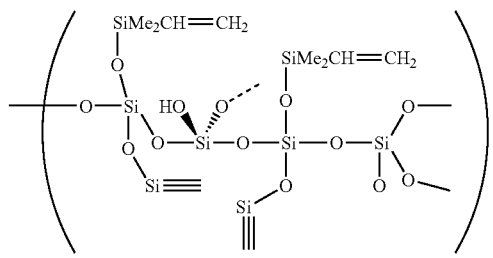

Examples of the alkenyl group-containing polysiloxane are VQM135 (GELEST Co., Ltd.) and VQM146 (GELEST Co., Ltd.) both containing the Q unit at a ratio of 20-25 mole %.

A second polysiloxane to be included in the silicone resin composition according to the embodiment is a hydro group-containing polysiloxane represented by the aforementioned average composition formula (B). This hydro group-containing polysiloxane is capable of reacting with the aforementioned alkenyl group-containing polysiloxane to generate a hydrosilylation reaction, thus acting as a crosslinking agent for curing the silicone composition.

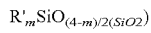
(B)

0.1 to 95 mole % of R' in the average composition formula (B) should be occupied by the hydro group. If the content of the hydro group is too small, the curing of the composition will become difficult. On the other hand, if the content of hydro group is too large, unreacted hydro group may be permitted to remain, thereby generating a problem that the stability of the cured material may be badly affected by the residual hydro group.

The balance of R' in the average composition formula (B) should be occupied by an alkyl group having 1 to 4 carbon atoms. In view of easiness of synthesis and cost, the employment of a methyl group is most preferable among the alkyl groups.

As described above, the inclusion of the Q unit is advantageous in that it is effective in enhancing the hardness of the cured material to be obtained. As long as the content of the Q unit in the aforementioned average composition formula (B) is not less than 10 mole %, it is possible to secure this advantage. However, if the content of the Q unit is too large, the hardness of the cured material to be obtained will become too high, thereby raising a problem that it may become difficult to secure a desirable adhesive property. Therefore, the upper limit in content of the Q unit in the average composition formula (B) should be confined to not more than 50 mole %.

The hydro group-containing polysiloxane represented by the aforementioned average composition formula (B) should be selected from those having a weight average molecular weight ranging from 100 to 10,000 based on the reduction in terms of polystyrene by GPC. If the weight average molecular weight of the hydro group-containing polysiloxane is less than 100, it may become difficult to obtain a cured material having a sufficiently high strength. On the other hand, if the weight average molecular weight of the hydro group-containing polysiloxane is higher than 10,000, it may become difficult to synthesize the polysiloxane. The weight average molecular weight of the hydro group-containing polysiloxane should preferably be confined to the range of 200 to 5,000, more preferably 400 to 3,000.

Incidentally, when the easiness of synthesis of polysiloxane is taken into account, "m" in the aforementioned average composition formula (B) should preferably be confined to the range of 1 to 3. When the hardness of cured material to be obtained is taken into account, it is especially preferable to confine the value of "m" to 2.3.

This hydro group-containing polysiloxane may partially comprise $RSiO_{3/2}$ (T unit).

For example, the ratios of each unit of M, D and Q may be formulated in such a way that the content of the Q unit is confined to the range of 10-50 mole %, the content of the M unit is confined to the range of 10-80 mole %, and the content of the D unit is confined to the range of 0-20 mole %.

The hydro group alkenyl group-containing polysiloxane-containing polysiloxane having such a structure can be easily synthesized by blending compounds each constituting a raw material of each unit (M unit, D unit, Q unit) at the aforementioned molar ratios and by subjecting these compounds to cohydrolysis in the presence of an acid.

As the raw materials for the $SiO_2$ unit (Q unit), they include sodium silicate, alkyl silicate, polyalkyl silicate and silicon tetrachloride.

As the raw materials for the $R_3SiO_{0.5}$ unit (M unit), they include the compounds which can be represented by the following chemical formulas.

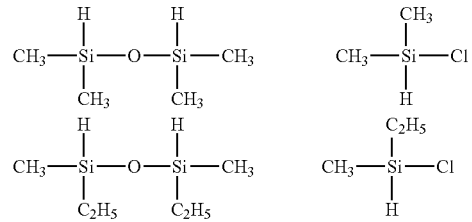

As examples of raw materials for the $R'_3SiO_{0.5}$ unit (M unit), they include compounds represented by the following chemical formulas.

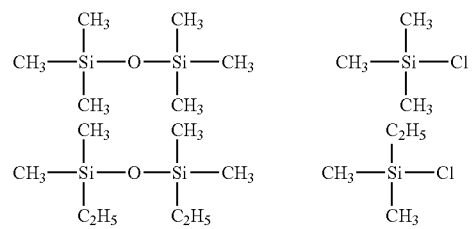

Further, examples of raw materials for the $R_2SiO_{2/2}$ unit (D unit) include compounds represented by the following chemical formulas.

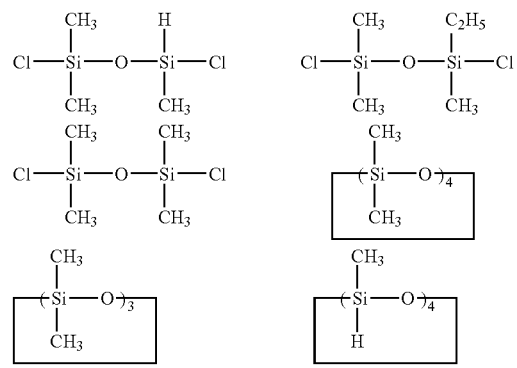

The hydro group-containing polysiloxane described above may be constructed such that an adhesion-imparting component is linked to the molecule of the polysiloxane. Alkoxy-containing silyl group that has been reacted with the hydro group of the average composition formula (B) may be enabled to act as an adhesion-imparting component. This adhesion-imparting component acts to enable alkenylalkoxy silane to preliminarily react with a part of the hydro group of the hydro group-containing polysiloxane.

In order to enable this reaction to proceed sufficiently, the hydro group-containing polysiloxane having an adhesion-imparting component linked thereto should preferably be incorporated at such a ratio that the number of silicon atoms to which the hydrogen atom is bonded falls within the range of 0.5-2 per alkenyl group of the alkenyl group-containing polysiloxane. If the number of silicon atoms is less than 0.5, the adhesive properties of the resultant resin may become insufficient. If the number of silicon atoms is larger than 2, the compatibility of the resultant resin may be deteriorated.

As examples of the hydro group-containing polysiloxane to be incorporated into the silicone resin composition according to the embodiment, they include those represented by the following general formula.

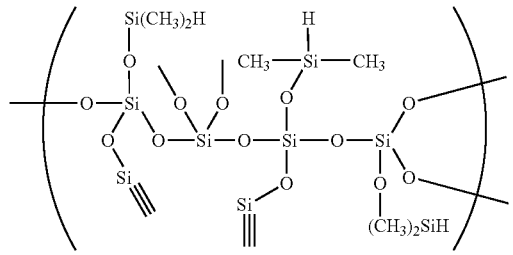

More specifically, examples of the hydro group-containing polysiloxane include those which can be obtained through the reaction between the hydro group of HQM105 (GELEST Co., Ltd.) and of HQM107 (GELEST Co., Ltd.) both comprising the Q unit and alkenylalkoxy silane in the presence of a catalyst such as platinic chloride. As the alkenylalkoxy silane to be employed in this case, it is possible to employ compounds represented by the following general formula.

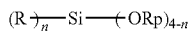

$(R)_n$—Si—$(OR_p)_{4-n}$ wherein n is an integer of 1 to 3; R is an alkenyl group including, for example, a vinyl group having 2-8 carbon atoms, aryl group, butenyl group and pentenyl group, a more preferable example thereof being a vinyl group; and $R_p$ is a monovalent hydrocarbon group including, for example, an alkyl group having 1-18 carbon atoms such as methyl, ethyl, propyl, butyl, hexyl, dodecyl and octadecyl, more preferable examples thereof being methyl and ethyl.

Some of $OR_p$ may be substituted by a monovalent hydrocarbon group or hydrogen atom. More specific examples of the alkenylalkoxy silane include vinyltrimethoxy silane and vinyltriethoxy silane.

Through a reaction between the aforementioned alkenylalkoxy silane and the aforementioned hydro group-containing polysiloxane, it is possible to obtain a hydro group-containing siloxane resin having an adhesion-imparting agent directly bonded thereto.

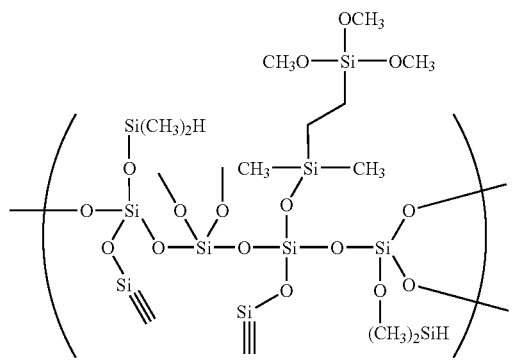

A third polysiloxane to be included in the silicone resin composition of the embodiment is formed of two kinds of polysiloxane both having opposite ends sealed with a vinyl group, differing in the range of molecular weight and represented by the following general formula (C):

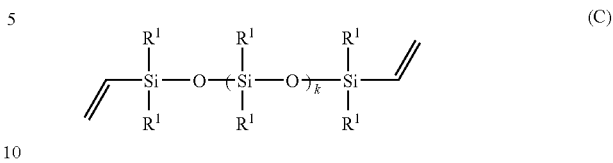

In this formula, $R^1$s may be the same or different and are individually selected from an alkyl group having 1 to 4 carbon atoms. In view of easiness of synthesis and manufacturing cost, it is most preferable that $R^1$s are selected from a methyl group and ethyl group.

Further, k is confined to the range of 20 to 300 and to the range of 700 to 1200.

A vinyl group-containing polysiloxane where k is confined to the range of 20 to 300 is incorporated in the resin composition for adjusting the viscosity of the resin composition. If the value of k is less than 20, the resultant cured material would become fragile. On the other hand, if the value of k exceeds 300, the effect thereof to decrease the viscosity of the resin composition would be undesirably decreased. Preferably, the value of k should be confined to the range of 30 to 250. The viscosity of this vinyl group-containing polysiloxane should preferably be confined within the range of 50-1000 mPa·s. As long as the viscosity of this vinyl group-containing polysiloxane is confined within this range, it is possible to prevent the cured state of resin composition from being deteriorated. More preferably, the viscosity of this polysiloxane having opposite ends sealed with a vinyl group should be confined within the range of 80-800 mPa·s.

Further, the employment of the polysiloxane having opposite ends sealed with a vinyl group where k is confined to the range of 700 to 1200 is effective in enhancing the adhesive property of the resin composition. If the value of k is less than 700, it may become difficult to obtain a cured material having a sufficient adhesive property. On the other hand, if the value of k becomes larger than 1200, the viscosity of the resin composition would become too high, thus badly affecting the workability of the resin composition. Preferably, the value of k should be confined to the range of 750 to 1100. The viscosity of this vinyl group-containing polysiloxane should preferably be confined within the range of 8000-30000 mPa·s. As long as the viscosity of this vinyl group-containing polysiloxane is confined within this range, it is possible to obviate any possibility of deteriorating the reactivity thereof that may be otherwise caused to occur due to high viscosity, and also to prevent the cured state of the resin composition from being deteriorated. More preferably, the viscosity of this polysiloxane having opposite ends sealed with a vinyl group should be confined within the range of 9000-25000 mPa·s.

Using two kinds of polysiloxane both having opposite ends sealed with a vinyl group and differing in the range of k from one another, it is possible to obtain the following advantages. First of all, it is possible to easily obtain a cured material excellent in adhesive property. Moreover, it is possible to secure a viscosity which is suited for workability. The viscosity of the resin composition should preferably be confined to not more than 5000 mPa·s. Incidentally, if only one kind of polysiloxane having opposite ends sealed with a vinyl group is employed, it may become difficult to obtain a cured material excellent in the adhesive property as well as a resin having a viscosity suited for workability.

The silicone resin composition according to the embodiment further comprises a platinum catalyst as a catalyst for executing the crosslinking of resin through a hydrosilylating reaction between the aforementioned alkenyl group-containing polysiloxane and the aforementioned hydro group-containing polysiloxane.

Examples of the platinum catalyst include a simple substance of platinum; solid platinum carried on a carrier such as alumina, silica, carbon black, etc.; platinic chloride; a complex of platinic chloride with alcohol, aldehyde, ketone, etc.; a platinum-olefin complex (for example, $Pt(CH_2=CH_2)_2$ $(PPh_3)_2$, $Pt(CH_2=CH_2)_2Cl_2$); a platinum-vinyl siloxane complex (for example, $Pt(ViMe_2SiOSiMe_2Vi)_n$, $Pt[(MeViSiO)_4]_m$); a platinum-phosphine complex (for example, $Pt(PPh_3)_4$, $Pt(PBu_3)_4$); a platinum-phosphite complex (for example, $Pt[P(OPh)_3]_4$, $Pt[P(OBu)_3]_4$)(wherein Me is a methyl group, Bu is a butyl group, Vi is a vinyl group, Ph is a phenyl group, and n and m are individually an integer); dicarbonyldichloroplatinate; and Karstedt catalyst.

Further, it is also possible to employ a non-platinum-based catalyst such as $RhCl(PPh)_3$, $RhCl_3$, $RhAl_2O_3$, $RuCl_3$, $IrCl_3$, $PdCl_2 \cdot 2H_2O$, $NiCl_2$, etc.

Among these catalysts, it is more preferable to employ platinic chloride, a platinum-olefin complex and a platinum-vinyl siloxane complex. Further, these catalysts may be employed singly or in combination of two or more kinds.

Although there is no specific limitation with regard to the content of the platinum catalyst, as long as the platinum catalyst is incorporated at a content of 0.1-500 ppm or so based on a total weight of the entire resin composition, it is possible to secure the effects of catalyst.

As described above, the silicone resin composition according to the embodiment comprises three specific kinds of polysiloxane. The alkenyl group-containing polysiloxane constituting the first polysiloxane and the hydro group-containing polysiloxane constituting the second polysiloxane both comprise a specific quantity of the Q unit which is small in cure shrinkage. Due to the presence of the Q unit, it is possible to secure an excellent adhesive property of the resin composition to a substrate such as polyphthalamide or to a metal. Moreover, since these polysiloxanes contain no unsaturated bonds, it is possible to enhance the light transmission properties thereof to the light of ultraviolet rays in particular.

Additionally, due to the inclusion of a vinyl group-containing polysiloxane as the third polysiloxane, it is possible to enhance the adhesive property of the resin composition to a substrate or to a metal. Further, since the silicone resin composition according to the embodiment is free from any kind of substituent group which is capable of absorbing light of the ultraviolet region, such as an aromatic ring and ester, the cured material of the silicone resin composition does not suffer any discoloration that may be caused to occur due to the change thereof with time.

Due to the inclusion of three kinds of polysiloxane, it is possible, with the employment of the silicone resin composition according to the embodiment, to obtain a cured material which is excellent in light transmission properties and in adhesive properties. Therefore, the silicone resin composition according to the embodiment is especially suited for use as a silicone resin composition for a white light-emitting diode (LED) device.

In addition to the aforementioned components, the silicone resin composition according to the embodiment may further comprise, insofar as the adhesive properties of the silicone resin composition is not badly affected, a chain silicone resin, cyclic silicone resin, or cage silicone resin. As examples of the silicone resin, they include polyorganoalkenyl siloxane and polyorganohydrogen siloxane.

As examples of the linear polyorganoalkenyl siloxane, they include compounds represented by the following general formula (a-1).

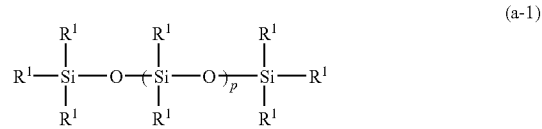

In the aforementioned general formula (a-1), p is an integer ranging from 0 to 10,000, at least two of $R^1$ are respectively alkenyl group and the balance thereof may be the same or different and are individually selected from a monovalent hydrocarbon group having 1-18 carbon atoms. As examples of the alkenyl group, they include a vinyl group, allyl group, 1-butenyl group and 1-hexenyl group. In view of easiness of synthesis, the employment of a vinyl group is more preferable. The alkenyl group may be introduced as $R^1$ into the terminal of a molecular chain or midway within a molecular chain. However, if the alkenyl group is bonded at least to the silicon atoms existing at the opposite terminals of the molecular chain, it is possible to accelerate the curing speed and to enhance the physical properties of the cured material.

As examples of the monovalent hydrocarbon group to be introduced as $R^1$ into the aforementioned general formula (a-1), they include for example an alkyl group, aryl group and aralkyl group. At least one of the hydrogen atoms in these hydrocarbon groups may be substituted by a heteroatom such as a halogen atom, Si atom, O atom, N atom and S atom. When the easiness of synthesis and excellent light transmission properties after curing are taken into account, the employment of a methyl group is more preferable. Examples of the linear polyorganoalkenyl siloxane are as shown below.

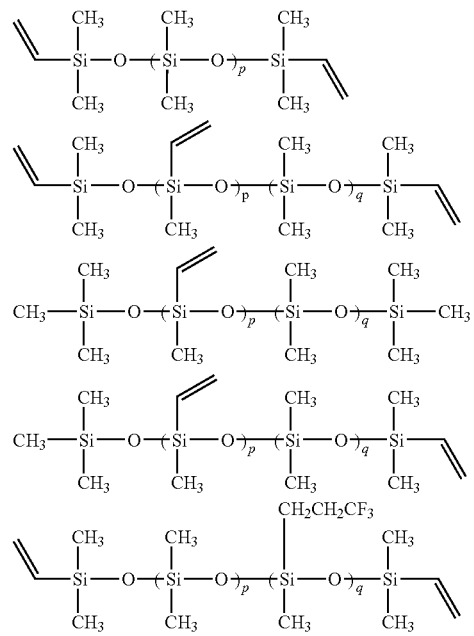

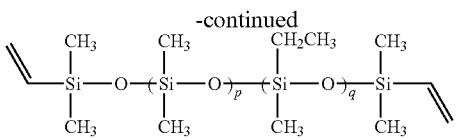

As examples of the cyclic polyorganoalkenyl siloxane, they include the compounds represented by the following general formula (a-2).

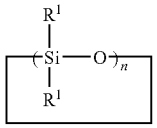

(a-2)

In the aforementioned general formula (a-2), n is an integer of 2 to 8, at least two of $R^1$ are respectively an alkenyl group and the balance thereof may be the same or different and are individually selected from a monovalent hydrocarbon group having 1-18 carbon atoms. As examples of the monovalent hydrocarbon group to be introduced as $R^1$ into the aforementioned general formula (a-2), they include, for example, an alkyl group, aryl group and aralkyl group. At least one of the hydrogen atoms in these hydrocarbon groups may be substituted by a heteroatom such as a halogen atom, Si atom, O atom, N atom and S atom. In this case, the employment of a methyl group is more preferable. Examples of the cyclic polyorganoalkenyl siloxane are as shown below.

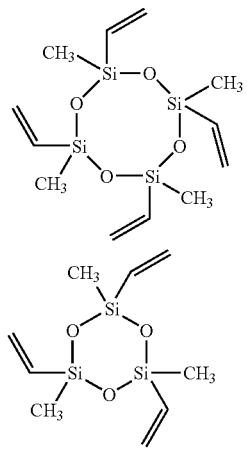

As the alkenyl group-containing polysiloxane of a three-dimensional or cage-like configuration, it is possible to employ the compounds represented by the following general formula (a-3).

 (a-3)

At least two of $R^1$ are respectively an alkenyl group and the balance thereof may be the same or different and are individually selected from a monovalent hydrocarbon group having 1-18 carbon atoms. As examples of the monovalent hydrocarbon group to be introduced as $R^1$ into the aforementioned general formula (a-3), they include, for example, an alkyl group, aryl group and aralkyl group. At least one of the hydrogen atoms in these hydrocarbon groups may be substituted by a heteroatom such as a halogen atom, Si atom, O atom, N atom and S atom. Among them, the employment of a methyl group is especially preferable. Examples of the alkenyl group-containing polysiloxane of a cage-like configuration are those represented by the following formula.

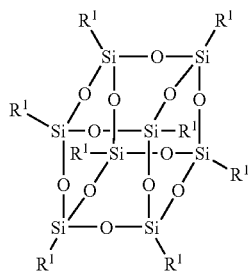

In this formula, at least two of $R^1$ are respectively an alkenyl group and the balance thereof may be an alkyl group such, for example, as a methyl group or hydroxyl group. More specifically, it may be a compound represented by the following chemical formula.

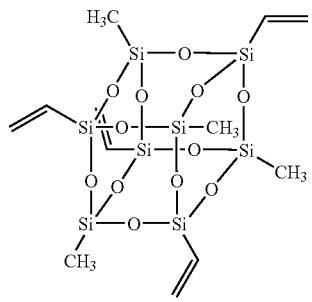

As examples of the linear polyorganohydrogen siloxane, they include the compounds represented by the following general formula (b-1).

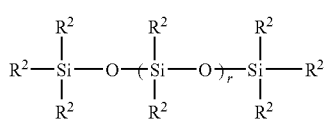

(b-1)

In the aforementioned general formula (b-1), r is an integer of 0 to 10,000, at least two of $R^2$ are respectively a hydro group and the balance thereof may be the same or different and are individually selected from a monovalent hydrocarbon group having 1-18 carbon atoms. As examples of the monovalent hydrocarbon group to be introduced as $R^2$ into the aforementioned general formula (b-1), they include, for example, an alkyl group, aryl group and aralkyl group. Especially, a methyl group is more preferable in terms of light transmission properties and manufacturing cost. Examples of the linear polyorganohydrogen siloxane are those represented by the following chemical formulas.

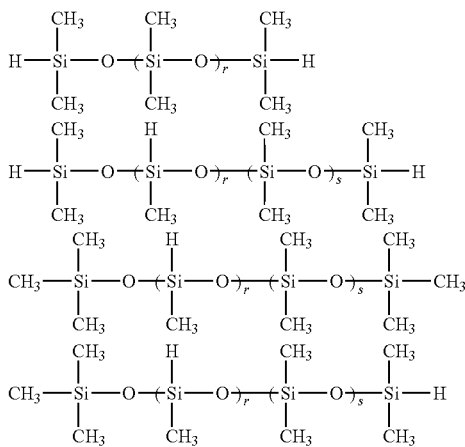

As examples of the cyclic polyorganohydrogen siloxane, they include the compounds represented by the following general formula (b-2).

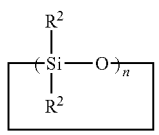 (b-2)

In the aforementioned general formula (b-2), n is an integer of 2 to 8, at least two of $R^2$ are respectively a hydro group and the balance thereof may be the same or different and are individually selected from a monovalent hydrocarbon group having 1-18 carbon atoms. As examples of the monovalent hydrocarbon group to be introduced as $R^2$ into the aforementioned general formula (b-2), they include for example an alkyl group, aryl group and aralkyl group. At least one of the hydrogen atoms in these hydrocarbon groups may be substituted by a heteroatom such as a halogen atom, Si atom, O atom, N atom and S atom. Especially, the employment of a methyl group is more preferable in terms of light transmission properties and manufacturing cost. Examples of the cyclic polyorganohydrogen siloxane are those represented by the following chemical formulas.

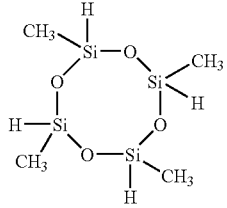 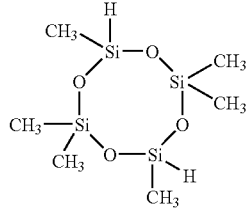

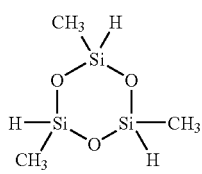 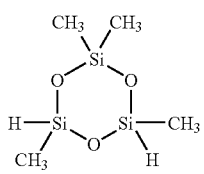

As the hydro group-containing polysiloxane of a three-dimensional or cage-like configuration, it is possible to employ the compounds represented by the following general formula (b-3).

$$R^2SiO_{3/2} \quad (b\text{-}3)$$

In this general formula (b-3), at least two of $R^2$ are respectively a hydro group and the balance thereof may be the same or different and are individually selected from a monovalent hydrocarbon group having 1-18 carbon atoms. As examples of the monovalent hydrocarbon group to be introduced as $R^2$ into the aforementioned general formula (b-3), they include for example an alkyl group, aryl group and aralkyl group. At least one of the hydrogen atoms in these hydrocarbon groups may be substituted by a heteroatom such as a halogen atom, Si atom, O atom, N atom and S atom. Among them, a methyl group is especially preferable.

Examples of the hydro group-containing polysiloxane of a cage-like configuration are those represented by the following general formula.

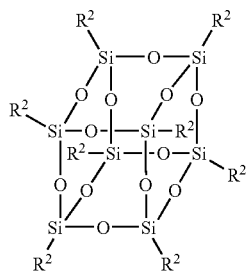

As already explained above with reference to the general formula (b-3), at least two of $R^2$ are respectively a hydro group and the balance thereof may be a methyl group. More specifically, it may be a compound represented by the following chemical formula.

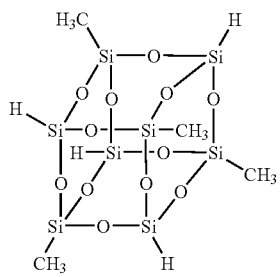

The silicone resin composition according to the embodiment may further comprise various kinds of additives insofar as the transparence and viscosity of the silicone resin composition would not be badly affected by the addition of these additives. Examples of such additives are silicon-based or fluorine-based antifoaming agents; and inorganic fillers such as fumed silica, silica aerosol, precipitated silica, crushed silica, diatomaceous earth, iron oxide, zinc oxide, titanium oxide, calcium oxide, magnesium carbonate, zinc carbonate and carbon black. If required, the silicone resin composition may further comprise other suitable additives including a pigment, dyestuff, an adhesion assistant, a mildewproofing agent, a heat resistance improver, a flame retardant or an antioxidant.

Next, the present invention will be further explained specifically with reference to examples, which are not intended to limit the scope of the present invention.

As the alkenyl group-containing polysiloxane represented by the aforementioned average composition formula (A), the following compounds were prepared.

(PSA1)

Ethyl polysilicate, vinyldimethyl chlorosilane and trimethyl chlorosilane were subjected to a cohydrolysis reaction in toluene, thereby polymerizing these compounds to obtain a liquid substance. It was confirmed by GPC that this liquid substance had a weight average molecular weight of 2,800. As a result of $^1$H-NMR, the content of the vinyl group represented by the alkenyl group was 33 mole % and the content of the Q uni-t was 60 mole %.

(PSA2)

Ethyl polysilicate, vinyldimethyl chlorosilane and trimethyl chlorosilane were subjected to a cohydrolysis reaction in toluene, thereby polymerizing these compounds to obtain a liquid substance. It was confirmed by GPC that this liquid substance had a weight average molecular weight of 2,800. As a result of $^1$H-NMR, the content of the vinyl group represented by the alkenyl group was 25 mole % and the content of the Q unit was 70 mole %.

(PSA3)

Ethyl polysilicate, vinyldiethyl chlorosilane and triethyl chlorosilane were subjected to a cohydrolysis reaction in toluene, thereby polymerizing these compounds to obtain a liquid substance. It was confirmed by GPC that this liquid substance had a weight average molecular-weight of 2,800. As a result of $^1$H-NMR, the content of the vinyl group represented by the alkenyl group was 33 mole % and the content of the Q unit was 60 mole %.

(PSA4)

Ethyl polysilicate, vinyldibutyl chlorosilane and trimethyl chlorosilane were subjected to a cohydrolysis reaction in toluene, thereby polymerizing these compounds to obtain a liquid substance. It was confirmed by GPC that this liquid substance had a weight average molecular weight of 3,300. As a result of $^1$H-NMR, the content of the vinyl group represented by the alkenyl group was 30 mole % and the content of the Q unit was 60 mole %.

(PSA5)

Ethyl polysilicate, vinylmethyl dichlorosilane and dimethyl dichlorosilane were subjected to a cohydrolysis reaction in toluene, thereby polymerizing these compounds to obtain a liquid substance. It was confirmed by GPC that this liquid substance had a weight average molecular weight of 4,000. As a result of $^1$H-NMR, the content of the vinyl group represented by the alkenyl group was 20 mole % and the content of the Q unit was 60 mole %.

(PSA6)

Ethyl polysilicate, vinylmethyl dichlorosilane and dibutyl dichlorosilane were subjected to a cohydrolysis reaction in toluene, thereby polymerizing these compounds to obtain a liquid substance. It was confirmed by GPC that this liquid substance had a weight average molecular weight of 4,200. As a result of $^1$H-NMR, the content of the vinyl group represented by the alkenyl group was 20 mole % and the content of the Q unit was 60 mole %.

(PSA7)

Ethyl polysilicate, vinyl trichlorosilane and methyl trichlorosilane were subjected to a cohydrolysis reaction in toluene, thereby polymerizing these compounds to obtain a liquid substance. It was confirmed by GPC that this liquid substance had a weight average molecular weight of 2,500. As a result of $^1$H-NMR, the content of the vinyl group represented by the alkenyl group was 10 mole % and the content of the Q unit was 60 mole %.

All of the alkenyl group-containing polysiloxanes of PSA1-PSA7 can be expressed by the aforementioned average composition formula (A). R, the content (mole %) of the alkenyl group, n, the molecular weight and the content (mole %) of the Q unit in the average composition formula (A) are summarized in the following Table 1. The value of n in each of these alkenyl group-containing polysiloxanes was determined by $^{29}$Si—NMR.

TABLE 1

| Polysiloxane | R | Alkenyl Kinds | Content (mol. %) | n | Weight av. molecular weight | Q unit (mol. %) |
|---|---|---|---|---|---|---|
| PSA1 | Methyl | Vinyl | 33 | 3 | 2800 | 60 |
| PSA2 | Methyl | Vinyl | 25 | 3 | 2900 | 70 |
| PSA3 | Ethyl | Vinyl | 33 | 3 | 2800 | 60 |
| PSA4 | Methyl Butyl | Vinyl | 30 | 3 | 3300 | 60 |
| PSA5 | Methyl | Vinyl | 20 | 2 | 4000 | 60 |
| PSA6 | Methyl Butyl | Vinyl | 20 | 2 | 4200 | 60 |
| PSA7 | Methyl | Vinyl | 10 | 1 | 2500 | 60 |

As the hydro group-containing polysiloxane represented by the aforementioned average composition formula (B), the following compounds were prepared.

(PSB1)

6 g of hydrosiloxane resin containing 20 mole % of a Q unit (product code: HQM105; GELEST Co., Ltd.) and 1 g of vinyltrimethoxy silane (SZ6300; Tohre Dow Corning Co., Ltd.) were subjected to a reaction in the presence of platinum chloride catalyst for one hour at a temperature of 100° C. to obtain a product. As a result of examination of this product by $^1$H-NMR, it was found out that the vinyl group of vinyltrimethoxy silane was completely removed from the product.

(PSB2)

6 g of hydrosiloxane resin containing 20 mole % of a Q unit (HQM105) and 2 g of vinyltrimethoxy silane (SZ6300) were subjected to reaction in the presence of a platinum chloride catalyst for one hour at a temperature of 100° C. to obtain a product. As a result of examination of this product by $^1$H-NMR, it was found out that the vinyl group of vinyltrimethoxy silane was completely removed from the product.

(PSB3)

6 g of hydrosiloxane resin containing 25 mole % of a Q unit (HQM107) and 2 g of vinyltrimethoxy silane (SZ6300) were subjected to reaction in the presence of platinum chloride catalyst for one hour at a temperature of 100° C. to obtain a product. As a result of examination of this product by $^1$H-NMR, it was found out that the vinyl group of vinyltrimethoxy silane was completely removed from the product.

(PSB4)

Ethyl polysilicate, hydrodiethyl chlorosilane and triethyl chlorosilane were subjected to cohydrolysis reaction in toluene, thereby polymerizing these compounds to obtain a liquid substance. It was confirmed by GPC that this liquid substance had a weight average molecular weight of 800. As a result of $^1$H-NMR, the content of the hydro group was 75 mole % and the content of the Q unit was 20 mole %.

6 g of this liquid substance and 1 g of vinyltrimethoxy silane (SZ6300) were subjected to reaction in the presence of platinum chloride catalyst for one hour at a temperature of 100° C. to obtain a product. As a result of examination of this product by $^1$H-NMR, it was found out that the vinyl group of vinyltrimethoxy silane was completely removed from the product.

(PSB5)

Ethyl polysilicate, hydrodibutyl chlorosilane and trimethyl chlorosilane were subjected to cohydrolysis reaction in toluene, thereby polymerizing these compounds to obtain a liquid substance. It was confirmed by GPC that this liquid substance had a weight average molecular weight of 820. As a result of $^1$H-NMR, the content of hydro group was 74 mole % and the content of the Q unit was 20 mole %.

6 g of this liquid substance and 1 g of vinyltrimethoxy silane (SZ6300) were subjected to reaction in the presence of platinum chloride catalyst for one hour at a temperature of 100° C. to obtain a product. As a result of examination of this product by $^1$H-NMR, it was found out that the vinyl group of vinyltrimethoxy silane was completely removed from the product.

(PSB6)

Ethyl Polysilicate, Hydromethyl Dichlorosilane and dimethyl dichlorosilane were subjected to cohydrolysis reaction in toluene, thereby polymerizing these compounds to obtain a liquid substance. It was confirmed by GPC that this liquid substance had a weight average molecular weight of 700. As a result of $^1$H-NMR, the content of the hydro group was 72 mole % and the content of the Q unit was 18 mole %.

6 g of this liquid substance and 1 g of vinyltrimethoxy silane (SZ6300) were subjected to reaction in the presence of platinum chloride catalyst for one hour at a temperature of 100° C. to obtain a product. As a result of examination of this product by $^1$H-NMR, it was found out that the vinyl group of vinyltrimethoxy silane was completely removed from the product.

(PSB7)

Ethyl polysilicate, hydroethyl dichlorosilane and diethyl dichlorosilane were subjected to cohydrolysis reaction in toluene, thereby polymerizing these compounds to obtain a liquid substance. It was confirmed by GPC that this liquid substance had a weight average molecular weight of 730. As a result of $^1$H-NMR, the content of the hydro group was 70 mole % and the content of the Q unit was 18 mole %.

6 g of this liquid substance and 1 g of vinyltrimethoxy silane (SZ6300) were subjected to reaction in the presence of platinum chloride catalyst for one hour at a temperature of 100° C. to obtain a product. As a result of examination of this product by $^1$H-NMR, it was found out that the vinyl group of vinyltrimethoxy silane was completely removed from the product.

(PSB8)

Ethyl polysilicate, hydrotrichlorosilane and methyl trichlorosilane were subjected to cohydrolysis reaction in toluene, thereby polymerizing these compounds to obtain a liquid substance. It was confirmed by GPC that this liquid substance had a weight average molecular weight of 670. As a result of $^1$H-NMR, the content of the hydro group was 74 mole % and the content of the Q unit was 20 mole %.

6 g of this liquid substance and 0.5 g of vinyltrimethoxy silane (SZ6300) were subjected to reaction in the presence of platinum chloride catalyst for one hour at a temperature of 100° C. to obtain a product. As a result of examination of this product by $^1$H-NMR, it was found out that the vinyl group of vinyltrimethoxy silane was completely removed from the product.

(PSB9)

Ethyl polysilicate, hydrotrichlorosilane and butyl trichlorosilane were subjected to cohydrolysis reaction in toluene, thereby polymerizing these compounds to obtain a liquid substance. It was confirmed by GPC that this liquid substance had a weight average molecular weight of 670. As a result of $^1$H-NMR, the content of the hydro group was 74 mole % and the content of the Q unit was 21 mole %.

6 g of this liquid substance and 0.3 g of vinyltrimethoxy silane (SZ6300) were subjected to reaction in the presence of platinum chloride catalyst for one hour at a temperature of 100° C. to obtain a product. As a result of examination of this product by $^1$H-NMR, it was found out that the vinyl group of vinyltrimethoxy silane was completely removed from the product.

All of the hydro group-containing polysiloxanes of PSB1-PSB9 can be expressed by the aforementioned average composition formula (B). R', the content (mole %) of the hydro group, m, weight average molecular weight and the content (mole %) of the Q unit in the average composition formula (B) are summarized in the following Table 2. The content of the hydro group as well as the content of the Q unit was determined by NMR and the weight average molecular weight was determined by GPC. The value of m in each of these hydro group-containing polysiloxanes was determined by $^1$H-NMR.

TABLE 2

| Polysiloxane | R' | Hydro group (mol. %) | m | Molecular weight | Q unit (mol. %) |
|---|---|---|---|---|---|
| PSB1 | Methyl | 68 | 3 | 640 | 20 |
| PSB2 | Methyl | 72 | 3 | 700 | 20 |
| PSB3 | Methyl | 76 | 3 | 800 | 25 |
| PSB4 | Ethyl | 75 | 3 | 800 | 20 |
| PSB5 | Methyl Butyl | 74 | 3 | 820 | 20 |
| PSB6 | Methyl | 72 | 2 | 700 | 18 |
| PSB7 | Ethyl | 70 | 2 | 730 | 18 |
| PSB8 | Methyl | 74 | 1 | 670 | 20 |
| PSB9 | Butyl | 74 | 1 | 670 | 21 |

As the vinyl group-containing polysiloxane represented by the aforementioned general formula (C), the following compounds were prepared.

(PSC1)

Polysiloxane having opposite ends sealed with a vinyl group: 100cSt in viscosity, 0.33-0.37 eq/kg (product code: DMS-V21; GELEST Co., Ltd.)

(PSC2)

Polysiloxane having opposite ends sealed with a vinyl group: 500 cSt in viscosity, 0.11-0.13 eq/kg (product code: DMS-V25; GELEST Co., Ltd.)

(PSC3)

Polysiloxane having opposite ends sealed with a vinyl group: 3500 cSt in viscosity, 0.05-0.06 eq/kg (product code: DMS-V31; GELEST Co., Ltd.)

(PSC4)

Polysiloxane having opposite ends sealed with a vinyl group: 10,000 cSt in viscosity, 0.08-0.12 eq/kg (product code: DMS-V41; GELEST Co., Ltd.)

(PSC5)

Polysiloxane having opposite ends sealed with a vinyl group: 20,000 cSt in viscosity, 0.07-0.09 eq/kg (product code: DMS-V42; GELEST Co., Ltd.)

(PSC6)

Polysiloxane having opposite ends sealed with a vinyl group: 6 cSt in viscosity, 2.4-2.9 eq/kg (product code: DMS-V05; GELEST Co., Ltd.)

All of the polysiloxanes having opposite ends sealed with a vinyl group according to PSC1-PSC6 can be expressed by the aforementioned general formula (C). $R^1$ and k in the general formula (C) are summarized in the following Table 3. $R^1$ was determined by $^1$H-NMR and the value of k was determined by GPC.

TABLE 3

| Polysiloxane | $R^1$ | k |
|---|---|---|
| PSC1 | Methyl | 80 |
| PSC2 | Methyl | 230 |
| PSC3 | Methyl | 580 |
| PSC4 | Methyl | 840 |
| PSC5 | Methyl | 970 |

As the platinum catalyst, a 2-propanol solution containing 2 mmol/L of platinic chloride was employed.

Each of the aforementioned components was mixed together according to the recipe shown in the following Table 4 and Table 5 to prepare the silicone resin compositions of Examples.

TABLE 4

| Polysiloxane | | Examples | | | | | | | |
|---|---|---|---|---|---|---|---|---|---|
| | | 1 | 2 | 3 | 4 | 5 | 6 | 7 | 8 |
| (A) | PSA1 | 17.7 | 19.8 | | | | | | |
| | PSA2 | | | 11.7 | | | | | |
| | PSA3 | | | | 8.6 | | | | |
| | PSA4 | | | | | 8.5 | | | |
| | PSA5 | | | | | | 8.7 | | |
| | PSA6 | | | | | | | 8.7 | |
| | PSA7 | | | | | | | | 8.7 |
| (B) | PSB1 | 5.0 | | | | | | | |
| | PSB2 | | 6.4 | | 2.4 | 3.5 | 2.0 | 2.0 | 2.1 |
| | PSB3 | | | 6.8 | | | | | |
| | PSB4 | | | | | | | | |
| | PSB5 | | | | | | | | |
| | PSB6 | | | | | | | | |
| | PSB7 | | | | | | | | |
| | PSB8 | | | | | | | | |
| | PSB9 | | | | | | | | |
| (C) | PSC1 | 24.1 | 14.3 | 46.6 | 13.0 | 12.8 | 13.0 | 13.0 | 13.0 |
| | PSC2 | | | | | | | | |
| | PSC3 | | | | | | | | |
| | PSC4 | 53.2 | 59.5 | | 76 | 75.2 | 76.3 | 76.3 | 76.2 |
| | PSC5 | | | 34.9 | | | | | |
| | Platinic chloride | 10 ppm | 10 ppm | 10 ppm | 10 ppm | 10 ppm | 10 ppm | 10 ppm | 10 ppm |

TABLE 5

| Polysiloxane | | Examples | | | | | | |
|---|---|---|---|---|---|---|---|---|
| | | 9 | 10 | 11 | 12 | 13 | 14 | 15 |
| (A) | PSA1 | 18.4 | 18.4 | 18.4 | 18.5 | 18.6 | 18.6 | |
| | PSA2 | | | | | | | 11.9 |
| | PSA3 | | | | | | | |
| | PSA4 | | | | | | | |
| | PSA5 | | | | | | | |
| | PSA6 | | | | | | | |
| | PSA7 | | | | | | | |
| (B) | PSB1 | | | | | | | |
| | PSB2 | | | | | | | |
| | PSB3 | | | | | | | |
| | PSB4 | 4.4 | | | | | | 9.5 |
| | PSB5 | | 4.4 | | | | | |
| | PSB6 | | | 4.4 | | | | |
| | PSB7 | | | | 4.0 | | | |
| | PSB8 | | | | | 3.5 | | |
| | PSB9 | | | | | | 3.1 | |
| (C) | PSC1 | 22.1 | 22.1 | 22.1 | 22.1 | 22.3 | 22.4 | 47.7 |
| | PSC2 | | | | | | | |
| | PSC3 | | | | | | | |
| | PSC4 | 55.1 | 55.1 | 55.1 | 55.4 | 55.6 | 55.9 | |
| | PSC5 | | | | | | | 35.9 |
| | Platinic chloride | 10 ppm | 10 ppm | 10 ppm | 10 ppm | 10 ppm | 10 ppm | 10 ppm |

The proportion of each of the polysiloxanes shown n Table 4 and Table 5 is indicated by weight %.

Further, each of the components was mixed together according to the recipe shown in the following Table 6 to prepare the silicone resin compositions of Comparative Examples.

TABLE 6

| Polysiloxane | | Comp. Examples | | | | | | | | |
|---|---|---|---|---|---|---|---|---|---|---|
| | | 1 | 2 | 3 | 4 | 5 | 6 | 7 | 8 | 9 |
| (A) | PSA1 | 23.9 | 23.5 | 23.5 | 24.1 | 24.3 | | | | 17.7 |
| | PSA2 | | | | | | | | | |
| | PSA3 | | | | | | | | | |
| | PSA4 | | | | | | | | | |
| | PSA5 | | | | | | | | | |
| | PSA6 | | | | | | | | | |
| | PSA7 | | | | | | | | | |
| (B) | PSB1 | 4.5 | | | | | 6.3 | 2.2 | 1.0 | 5.0 |
| | PSB2 | | 6.4 | | | | | | | |
| | PSB3 | | | 6.1 | | | | | | |
| | PSB4 | | | | | | | | | |
| | PSB5 | | | | | | | | | |
| | PSB6 | | | | 3.6 | | | | | |
| | PSB7 | | | | | | | | | |
| | PSB8 | | | | | 2.8 | | | | |
| | PSB9 | | | | | | | | | |
| (C) | PSC1 | | | | | | 93.7 | | | |
| | PSC2 | | | | | | | 97.8 | | |
| | PSC3 | | | | | | | | 99 | |
| | PSC4 | | | | | | | | | 16.5 |
| | PSC5 | | | | | | | | | |
| | PSC6 | | | | | | | | | 0.1 |
| Platinic chloride | | 10 ppm | 10 ppm | 10 ppm | 10 ppm | 10 ppm | 10 ppm | 10 ppm | 10 ppm | 10 ppm |

As shown in Table 6, the compositions of Comparative Examples 1-5 were all formulated so as to contain no vinyl group-containing polysiloxane of low molecular weight. Whereas, the compositions of Comparative Examples 6-8 were all formulated so as to contain no vinyl group-containing polysiloxane of high molecular weight.

All of the aforementioned resin compositions were allowed to cure to obtain cured products, and the light transmission properties of these cured products were investigated. More specifically, each of these compositions was coated on a quartz substrate using a bar coater to form a coated film. Then, the coated film was placed, together with the quartz substrate, on a hot plate heated to a predetermined temperature and subjected to heat treatment wherein the coated film was heated at a temperature of 100° C. for one hour and then at a temperature of 150° C. for three hours to cure the coated film. As a result, a cured material consisting of membrane having a thickness of 0.3 mm was formed. Thereafter, a low-pressure mercury lamp was disposed at a position spaced apart from the membrane by a distance of 10 cm and the membrane was irradiated by the mercury lamp for 1000 hours.

Thereafter, using a spectrophotometer, the light transmittance of the cured products was measured. The measurement of light transmittance was conducted using two wavelengths, i.e. 400 nm and 300 nm. The light transmittance to the light having a wavelength of 400 nm is considered as being an indication of transparency of a white LED as the fluorescent substance thereof is excited with ultraviolet rays. Likewise, the light transmittance to the light having a wavelength of 300 nm is also considered as being an indication of transparency of a white LED. In order to obtain a silicone resin sealing material which is capable of retaining excellent light transmittance for a long period of time, it is required that the light transmittance to the light of not only the wavelength of 400 nm but also the wavelength of 300 nm should be not less than 85%.

Further, the shrinkage factor of the cured products was also investigated. More specifically, the shrinkage factor of the cured products was evaluated based on a difference in specific gravity of the resin before and after the curing of resin. If the shrinkage factor of the cured products is confined to not more than 4.5%, it can be said to be acceptable.

Furthermore, using IR reflow, the peeling at an interface between the silicone resin and the package was observed. The samples for the IR reflow were manufactured as follows. The silicone resin composition was poured into a recess (a columnar configuration having a diameter of 3 mm and a height of 2 mm) of the package which was formed of PPA (polyphthal amide) resin and then heated at a predetermined temperature to cure the silicone resin composition.

Thereafter, the cured resin was introduced, together with the package, into a high-temperature humidifying tank to allow the cured product of silicone resin to absorb moisture. Then, the cured product of silicone resin was subjected to the IR reflow treatment (260° C./10 seconds). Under the same conditions, the moisture absorption and the IR reflow were repeated. The peeling at an interface between the silicone resin and the package was observed by a microscope. The number of repetitions of the aforementioned process which could be executed before the generation of peeling was measured. If the number of repetitions was 8 or more, it can be said as having sufficient adhesive properties.

The results thus obtained are summarized in the following Tables 7 and 8.

TABLE 7

| | Transparency (400 nm) | Transparency (300 nm) | Shrinkage factor (%) | Number of repetition before peeling |
|---|---|---|---|---|
| Ex. 1 | 94 | 92 | 3.8 | 15 times |
| Ex. 2 | 94 | 92 | 3.8 | 16 times |

TABLE 7-continued

|  | Transparency (400 nm) | Transparency (300 nm) | Shrinkage factor (%) | Number of repetition before peeling |
|---|---|---|---|---|
| Ex. 3 | 94 | 92 | 3.8 | 15 times |
| Ex. 4 | 94 | 92 | 3.8 | 15 times |
| Ex. 5 | 94 | 92 | 3.9 | 13 times |
| Ex. 6 | 94 | 92 | 4.0 | 10 times |
| Ex. 7 | 94 | 92 | 4.0 | 9 times |
| Ex. 8 | 94 | 92 | 4.1 | 8 times |
| Ex. 9 | 94 | 92 | 3.8 | 14 times |
| Ex. 10 | 94 | 92 | 3.9 | 12 times |
| Ex. 11 | 94 | 92 | 4.1 | 11 times |
| Ex. 12 | 94 | 92 | 4.1 | 10 times |
| Ex. 13 | 94 | 92 | 4.2 | 9 times |
| Ex. 14 | 94 | 92 | 4.3 | 8 times |
| Ex. 15 | 94 | 92 | 3.8 | 14 times |

TABLE 8

|  | Transparency (400 nm) | Transparency (300 nm) | Shrinkage factor (%) | Number of repetition before peeling |
|---|---|---|---|---|
| Comp. Ex. 1 | 94 | 92 | 3.9 | 6 times |
| Comp. Ex. 2 | 94 | 92 | 4.0 | 6 times |
| Comp. Ex. 3 | 94 | 92 | 4.0 | 6 times |
| Comp. Ex. 4 | 94 | 92 | 4.2 | 6 times |
| Comp. Ex. 5 | 94 | 92 | 4.2 | 5 times |
| Comp. Ex. 6 | 94 | 92 | 5.1 | 1 time |
| Comp. Ex. 7 | 94 | 92 | 5.0 | 1 time |
| Comp. Ex. 8 | 94 | 92 | 5.0 | 1 time |
| Comp. Ex. 9 | 94 | 92 | 4.9 | 3 times |

As shown in Tables 7 and 8, as far as the light transmittance is concerned, the compositions of not only Examples but also Comparative Examples were found as exhibiting excellent light transmittance to the light of 400 nm and of 300 nm in wavelength. With respect to the shrinkage factor, while the resin compositions of Examples all indicated not more than 4.3%, some of the resin compositions of Examples indicated a shrinkage factor of up to 5.1%.

With respect to adhesive properties of cured products, the resin compositions of Examples 1-5, 9, 10 and 15 indicated excellent adhesive properties with the number of aforementioned repetitions before the generation of peeling being 12 or more. In the case of the alkenyl group-containing polysiloxane contained in these compositions, n in the average composition formula (A) was 3. Further, in the case of the hydro group-containing polysiloxane contained in these compositions, m in the average composition formula (B) was 3. Especially, in the examples where a methyl group was included as an alkyl group (Examples 1-3), it was possible to secure high adhesive properties.

In the case of the resin compositions of Comparative Examples 6-8 where an alkenyl group-containing polysiloxane of low molecular weight was not included therein, it was almost impossible to expect any substantial adhesive properties. In the case of the resin compositions of Comparative Examples 1-3, they contained an alkenyl group-containing polysiloxane where n in the average composition formula (A) was 3 and a hydro group-containing polysiloxane where m in the average composition formula (B) was 3. However, they failed to contain a vinyl group-containing polysiloxane of low molecular weight represented by the general formula (C), and the viscosity of these resin compositions was caused to become high. As a result, the workability of these resin compositions was deteriorated, thus failing to obtain a cured product exhibiting excellent adhesive properties.

As described above, only when three specific kinds of polysiloxane are included in the silicone resin composition is it possible to obtain a silicone resin composition which is excellent in transparency and in adhesive properties, and is also capable of forming a cured material which does not suffer discoloration that may be caused to occur due to the change thereof with time.

FIGURE is a schematic diagram showing the construction of a semiconductor device according to one embodiment. The semiconductor device shown herein is an LED light-emitting device comprising a substrate 4 having a recess, a diode chip 6 placed in this recess, and a transparent resin layer 2 covering the diode chip 6. The substrate 4 is provided with an inner electrode 5a and an outer electrode 5b. The connecting terminal (not shown) of the diode chip 6 is connected, through a conductive wire 3, with the inner electrode 5a.

Since the light is enabled to emit after passing through the resin layer, the transparent resin layer 2 covering the diode chip 6 is required to exhibit high transparency. Since the silicone resin composition according to one embodiment is capable of exhibiting excellent transparency as described above, the silicone resin composition can be quite suited for use for forming the transparent resin layer 2.

Incidentally, since a semiconductor device can be encapsulated with a cured material to be created through the curing of the silicone resin composition according to the embodiment, this silicone resin composition of the embodiment can be employed for the manufacture of various kinds of semiconductor devices. For example, a flip-chip packaging type semiconductor device can be encapsulated by a cured material of the silicone resin composition of the embodiment, thereby obtaining a semiconductor device which is excellent in alleviating any thermal stress. Further, the silicone resin composition according to the embodiment may be applied to the sealing of the electrolyte of pigment-sensitizing solar battery. When the silicone resin composition of the embodiment of the present invention is applied to a pigment-sensitizing solar battery, the durability thereof would be enhanced.

Moreover, the silicone resin composition according to the embodiment can be applied not only to a semiconductor device but also for various other purposes. For example, it can be suitably used for forming a dipping agent for general industrial purpose, a profiling rubber, a molding material, a stripping coating agent, an addition reaction type silicone rubber or silicone gel such as a dental impression material, etc. Even when the silicone resin composition of the embodiment of the present invention is used for these purposes, it is possible to secure the effects of high adhesive properties, thus indicating a wide range of utility.

According to the embodiment of the present invention, there is provided a silicone resin composition which is excellent in transparency, is capable of obviating discoloration with time and also is capable of giving a cured material excellent in adhesive properties, as well as a semiconductor device whose semiconductor elements are encapsulated with a cured material of this silicone resin composition.

Additional advantages and modifications will readily occur to those skilled in the art. Therefore, the invention in its broader aspects is not limited to the specific details and representative embodiments shown and described herein.

Accordingly, various modifications may be made without departing from the spirit or scope of the general inventive concept as defined by the appended claims and their equivalents.

What is claimed is:

1. A silicone resin composition comprising:

a) an alkenyl group-containing polysiloxane represented by a following average composition formula "A":

$$R_nSiO_{(4-n)/2}(SiO_2) \quad A$$

wherein R consists of an alkenyl group of 0.1 to 95 mole % and an alkyl group having 1 to 4 carbon atoms; and n is an integer of 1 to 3, and wherein at least one of the hydrogen atoms in the R is substituted by a heteroatom selected from the group consisting of a halogen atom, Si atom, O atom, N atom, and S atom, the alkenyl group-containing polysiloxane having a weight average molecular weight of 400 to 30000 and including 20 to 80 mole % of a Q unit represented by a following formula:

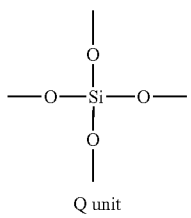

Q unit b) a hydro group-containing polysiloxane represented by a following average composition formula "B":

$$R'_mSiO_{(4-m)/2}(SiO_2) \quad B$$

wherein R' consists of a hydro group of 0.1 to 95 mole % and an alkyl group having 1 to 4 carbon atoms; and m is an integer of 1 to 3, the hydro group-containing polysiloxane having a weight average molecular weight of 100 to 10000 and including 10 to 50 mole % of the Q unit represented by the aforementioned formula: and c) a pair of polysiloxane each having opposite ends sealed with a vinyl group, differing in a range of "k" and represented by a following average composition formula "C":

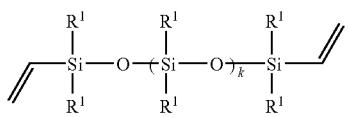

wherein R¹s may be same or different and are individually selected from an alkyl group having 1 to 4 carbon atoms; and k is 20 to 300 or 700 to 1200; and d) a hydrosilylating catalyst.

2. The composition according to claim 1, wherein the alkenyl group to be introduced into the R in the average composition formula "A" is selected from those having 2 to 8 carbon atoms.

3. The composition according to claim 2, wherein the alkenyl group is selected from a group consisting of a vinyl group, allyl group, butenyl group and pentenyl group.

4. The composition according to claim 3, wherein the alkenyl group is a vinyl group.

5. The composition according to claim 4, wherein the alkyl group to be introduced into the R in the average composition formula "A" is a methyl group.

6. The composition according to claim 1, wherein the alkenyl group-containing polysiloxane has a weight average molecular weight ranging from 1,000 to 10,000.

7. The composition according to claim 1, wherein the R' in the average composition formula "B" is a methyl group.

8. The composition according to claim 1, wherein the hydro group-containing polysiloxane has a weight average molecular weight ranging from 200 to 5,000.

9. The composition according to claim 1, wherein the hydro group-containing polysiloxane is incorporated at a ratio that a number of silicon atoms to which hydrogen atom is bonded falls within a range of 0.5-2 per alkenyl group of an alkenyl group-containing polysiloxane.

10. The composition according to claim 1, wherein the R¹ to be introduced into the formula "C" is selected from a methyl group and an ethyl group.

11. The composition according to claim 1, wherein the hydrosilylating catalyst is selected from a group consisting of platinic chloride, a platinum-olefin complex and a platinum-vinyl siloxane complex.

12. The composition according to claim 1, wherein the hydrosilylating catalyst is incorporated at a ratio ranging from 0.1 to 500 ppm based on a total weight of the composition.

13. The composition according to claim 1, further comprising at least one selected from a group consisting of chain silicone resin, cyclic silicone resin and cage silicone resin.

14. The composition according to claim 13, wherein the silicone resin is selected from a group consisting of polyorganoalkenyl siloxane and polyorganohydrogen siloxane.

15. The composition according to claim 1, further comprising at least one selected from a group consisting of antifoaming agents, fumed silica, silica aerosol, precipitated silica, crushed silica, diatomaceous earth, iron oxide, zinc oxide, titanium oxide, calcium oxide, magnesium carbonate, zinc carbonate, carbon black, pigment, dyestuff, an adhesion assistant, a mildewproofing agent, a heat resistance improver, a flame retardant and an antioxidant.

16. A resin-encapsulated semiconductor device comprising:

a light-emitting element; and a resin layer encapsulating the light-emitting element, the resin layer being formed of a cured material to be obtained through curing of the silicone resin composition of claim 1.

* * * * *